United States Patent
Kavalipurapu et al.

(10) Patent No.: US 11,861,236 B2
(45) Date of Patent: *Jan. 2, 2024

(54) ASYMMETRIC PLANE DRIVER CIRCUITS IN A MULTI-PLANE MEMORY DEVICE

(71) Applicant: Micron Technology, Inc., Boise, ID (US)

(72) Inventors: Kalyan Chakravarthy C. Kavalipurapu, Hyderabad (IN); Chang H. Siau, Saratoga, CA (US); Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/742,294

(22) Filed: May 11, 2022

(65) Prior Publication Data
US 2022/0276806 A1 Sep. 1, 2022

Related U.S. Application Data

(63) Continuation of application No. 16/947,525, filed on Aug. 5, 2020, now Pat. No. 11,354,067.

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0683* (2013.01);
(Continued)

(58) Field of Classification Search
CPC ... G11C 16/26; G11C 2207/2209; G11C 8/12; G11C 16/08; G11C 16/32; G11C 7/22; G11C 16/0483; G11C 16/10; G11C 5/066; G11C 8/16; G11C 8/18; G11C 11/005; G11C 11/5642; G11C 13/0004; G11C 13/0038; G11C 13/004; G11C 16/14;
(Continued)

(56) References Cited

U.S. PATENT DOCUMENTS 10,755,755 B2 * 8/2020 Pekny .................... G11C 16/26
11,354,067 B2 * 6/2022 Kavalipurapu ....... G06F 3/0604
(Continued)

OTHER PUBLICATIONS

PCT International Search Report and Written Opinion for International Application No. PCT/US2021/044561 dated Nov. 8, 2021, 13 pages.

*Primary Examiner* — Thong Q Le
(74) *Attorney, Agent, or Firm* — Lowenstein Sandler LLP

(57) ABSTRACT

A memory device includes a memory array comprising a plurality of planes, a primary plane driver circuit comprising components to support read operations, program operations, and erase operations on any of the plurality of planes, and a secondary plane driver circuit comprising components to support read operations on an associated one of the plurality of planes. The primary plane driver circuit is configured to perform a first read operation on a first plane of the plurality of planes and the secondary plane driver circuit is configured to perform a second read operation on a second plane of the plurality of planes concurrently with the first read operation.

20 Claims, 8 Drawing Sheets

(51) Int. Cl.
  *G11C 16/08* (2006.01)
  *G11C 16/10* (2006.01)
  *G11C 16/14* (2006.01)
  *G11C 16/26* (2006.01)
  *G11C 16/04* (2006.01)

(52) U.S. Cl.
  CPC .............. *G11C 16/08* (2013.01); *G11C 16/10* (2013.01); *G11C 16/14* (2013.01); *G11C 16/26* (2013.01); *G11C 16/0483* (2013.01)

(58) Field of Classification Search
  CPC ..... G11C 16/30; G11C 7/1042; G11C 7/1075; G11C 8/08; G06F 3/0604; G06F 3/0659; G06F 3/0673; G06F 13/1668; G06F 3/0644; G06F 13/16; G06F 13/42; G06F 3/0629; G06F 3/0683; G06F 9/30145
  See application file for complete search history.

(56) References Cited

U.S. PATENT DOCUMENTS

| | | |
|---|---|---|
| 2012/0230108 A1 | 9/2012 | Missiroli et al. |
| 2016/0048343 A1 | 2/2016 | Pekny et al. |
| 2018/0357123 A1 | 12/2018 | Yin et al. |
| 2020/0233613 A1 | 7/2020 | Tokiwa |

* cited by examiner

ASYMMETRIC PLANE DRIVER CIRCUITS IN A MULTI-PLANE MEMORY DEVICE

RELATED APPLICATIONS

This application is a continuation of U.S. patent application Ser. No. 16/947,525, filed Aug. 5, 2020, the entire contents of which is hereby incorporated by reference herein.

TECHNICAL FIELD

Embodiments of the disclosure relate generally to memory sub-systems, and more specifically, relate to asymmetric plane driver circuits in a multi-plane memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
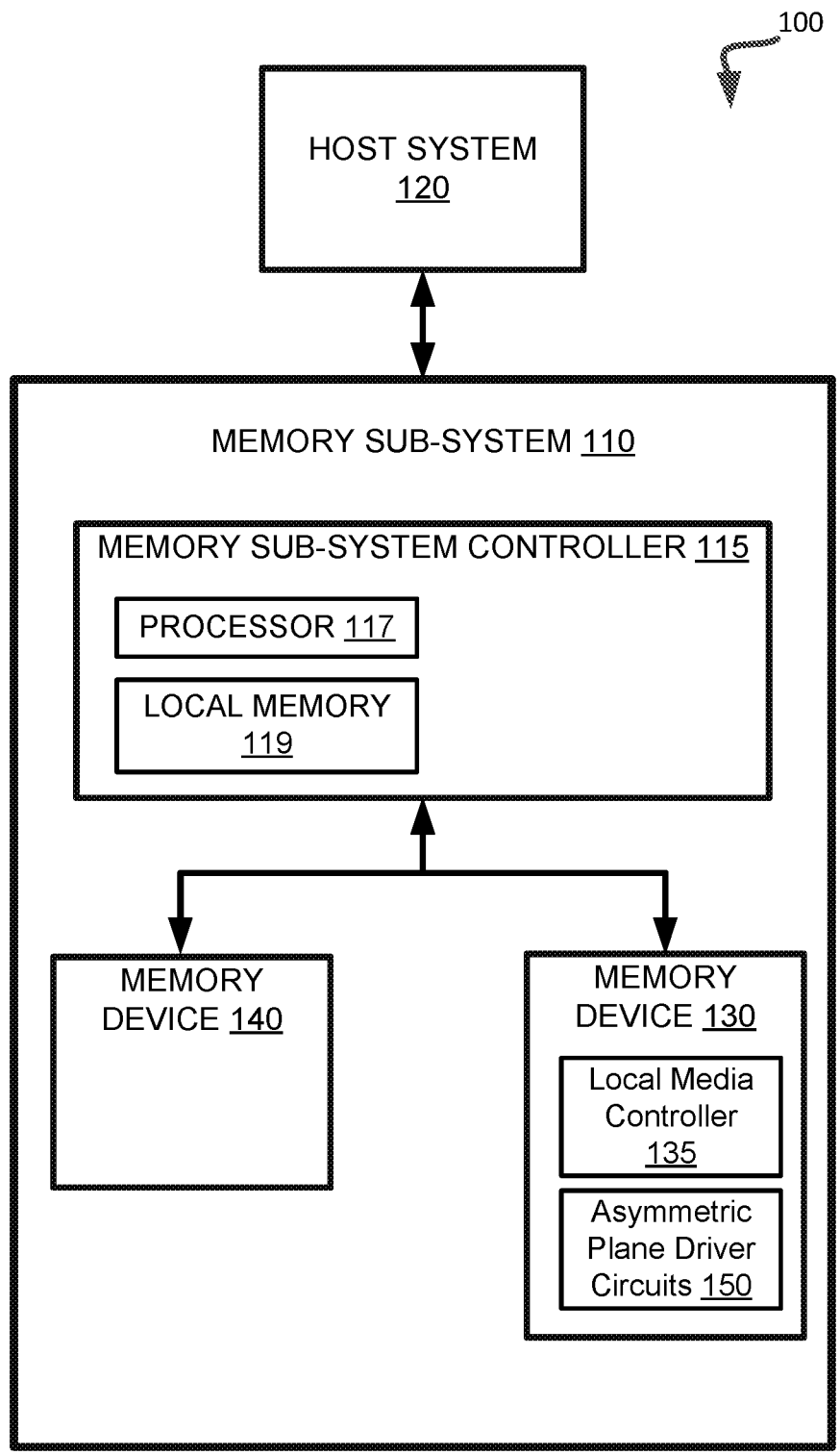
FIG. 1 illustrates an example computing system that includes a memory sub-system in accordance with some embodiments of the present disclosure.

Aspects of the present disclosure are directed to asymmetric plane driver circuits in a multi-plane memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits.

In each generation of memory devices, the architecture of the memory array trends toward a smaller physical footprint while maintaining or even increasing the memory capacity. The independent plane driver circuits, and other circuitry associated with the memory array, are located in a logic layer disposed beneath the memory array. Accordingly, as the footprint of the memory array decreases, it can be desirable to similarly decrease the footprint of this logic layer to avoid peripheral extension of the logic layer beyond the footprint of the associated memory array. Since the independent plane driver circuits support improved random read performance on high density memory arrays, it is desirable to maintain the multi-lane parallel access functionality provided by the independent plane driver circuits even despite the size reduction of the logic layer where they reside. This objective is at odds, however, with the number of independent plane driver circuits used in a multi-plane memory device, as well as any additional circuitry needed to support additional vertical layers (i.e., tiers) added to the three-dimensional memory array.

Some memory devices attempt to facilitate the reduction of the footprint of the logic layer by maintaining a certain number of duplicate plane driver circuits with certain concessions. For example, some memory devices make reductions to a number of inhibit schemes that can be supported in the memory device, a number of bias sources available to the plane driver circuits, a number of high voltage switches present in the memory device architecture, and/or a length of the high voltage switches used in the plane driver circuits. These concessions can lead to a reduced area for each of the duplicate plane driver circuits, but can result in an increased program disturbance effect, decreased read/window budget, increased time to market, increased switching constraints, decreased reliability, and/or other negative performance or operational impacts.

Aspects of the present disclosure address the above and other deficiencies by implementing asymmetric plane driver circuits in a multi-plane memory device. In one embodiment, the asymmetric plane driver circuits include one or more primary plane driver circuits and one or more secondary plane driver circuits having different functionality than the primary plane driver circuits. A primary plane driver circuit can include components to allow the primary plane driver circuit to perform read, program, and erase operations on the planes of the multi-plane memory device. For example, the primary plane driver circuit can include high voltage sources used to apply relatively high program and/or erase voltages during a program and/or erase operation respectively, a number of high voltage switches and associated control logic used to perform program and erase operations, test mode circuitry, and other components utilized to perform read, program, and erase operations. The multi-plane memory device can further include signal routing lines and switches to connect the primary plane driver circuit to each plane, or to a subset of the planes, in the multi-plane memory device to permit primary plane driver circuit to perform program or erase operations, for example, on two or more planes in parallel. A secondary plane driver circuit can include fewer components than a primary plane driver circuit, such as components to allow the secondary plane driver circuit to perform read operations on an associated plane of the multi-plane memory device. For example, the primary plane driver circuit can include drivers to support program/erase/read and test mode operations, as well as high voltage switches with larger channel lengths to address reliability concerns since the primary plane driver circuit supports program and erase operations. By comparison, the secondary plane driver circuits can include only drivers to support read operations, and these drivers can include high voltage switches with smaller channel lengths since the read voltages are not as high as the program and erase voltages. In one embodiment, each of the one or more secondary plane driver circuits is associated with only one plane of the multi-plane memory device and each of the one or more secondary plane driver circuits can perform a separate read operation on its associated plane concurrently. Since the multi-plane memory device architecture can support concurrent read operations on separate planes, the secondary plane driver circuits can provide this functionality while the primary plane driver circuit can be used for program or erase operations performed on individual planes or separate planes in parallel.

Advantages of this approach include, but are not limited to, a reduction in size of the logic layer in a multi-plane memory device. Since the secondary plane driver circuits include fewer components, they can be manufactured to occupy less area than a primary plane driver circuit in the logic layer of the memory device, thereby permitting the logic layer to have a smaller footprint than if a primary plane driver circuit were included for each plane of the multi-plane memory device. In addition, the scalability of additional memory planes or vertical memory tiers to the memory array of the memory device is possible without incurring proportional increases to the footprint of the logic layer. Furthermore, compromises to the functionality and performance of the plane driver circuits do not occur in order to realize the decrease in size, as none of reductions to the inhibit schemes used in the memory device, the number of bias sources available to the plane driver circuits, and/or the channel length of devices used in high voltage switches are necessary. Accordingly, the asymmetric plane driver circuit architecture described herein provides the same functionality as a symmetric architecture, but with significant savings in the size of the circuitry in the logic layer of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory device 130 includes asymmetric plane driver circuits 150 used to perform memory access operations on the multiple memory planes of memory device 130. In one embodiment, the asymmetric plane driver circuits 150 include one or more primary plane driver circuits and one or more secondary plane driver circuits having different functionality than the primary plane driver circuits. For example, a primary plane driver circuit can include components to support read operations, program operations, and erase operations on any of the planes of memory device 130. For example, the primary plane driver circuit can include high voltage sources used to apply relatively high program/erase voltages during a program/erase operation respectively, a number of high voltage switches and associated control logic used to perform program and erase operations, test mode circuitry, and other components utilized to perform read, program, and erase operations. The one or more secondary plane driver circuits can each include fewer components than a primary plane driver circuit, such as components to allow the secondary plane driver circuit to perform read operations on an associated one of the planes of memory device 130. Since a secondary plane driver circuit includes fewer components than a primary plane driver circuit, the secondary plane driver circuit can occupy a smaller footprint area than then primary plane driver circuit. In one embodiment, the footprint area represents the two-dimensional amount of space that a given component occupies on a substrate (e.g., silicon wafer) that forms the logic layer. In one embodiment, the footprint area of a secondary plane driver circuit can be approximately one third of the footprint area of a primary plane driver circuit.

In one embodiment, memory device 130 further includes signal routing lines and switches to connect the primary plane driver circuit to each plane, or to a subset of the planes, to permit primary plane driver circuit to perform program or erase operations, for example, on two or more planes in parallel. In one embodiment, each secondary plane driver circuit is associated with only one plane of memory device 130. The signal routing lines and switches further connect each secondary plane driver circuit directly to the associated plane, so that each secondary plane driver circuit can perform a separate read operation on its associated plane concurrently. In one embodiment, local media controller 135 of memory device 130 receives memory access commands, such as a read commands directed to different planes of memory device 130, and configures the routing circuitry (i.e., the signal routing lines and switches) to couple the primary plane driver circuit and secondary plane driver circuits to the appropriate planes to concurrently perform memory operations, such as read operations, corresponding to the received memory access commands. Further details with regards to the operations of local media controller 135 and asymmetric plane driver circuits 150 are described below.

In some embodiments, memory device 130 includes local media controller 135 and at least a portion of asymmetric plane driver circuits 150 and is configured to perform the functionality described herein. In such an embodiment, asymmetric plane driver circuits 150 can be implemented using hardware or as firmware, stored on memory device 130, executed by the control logic (e.g., local media controller 135) to perform the operations related to concurrent memory plane access described herein.

Figure 2:
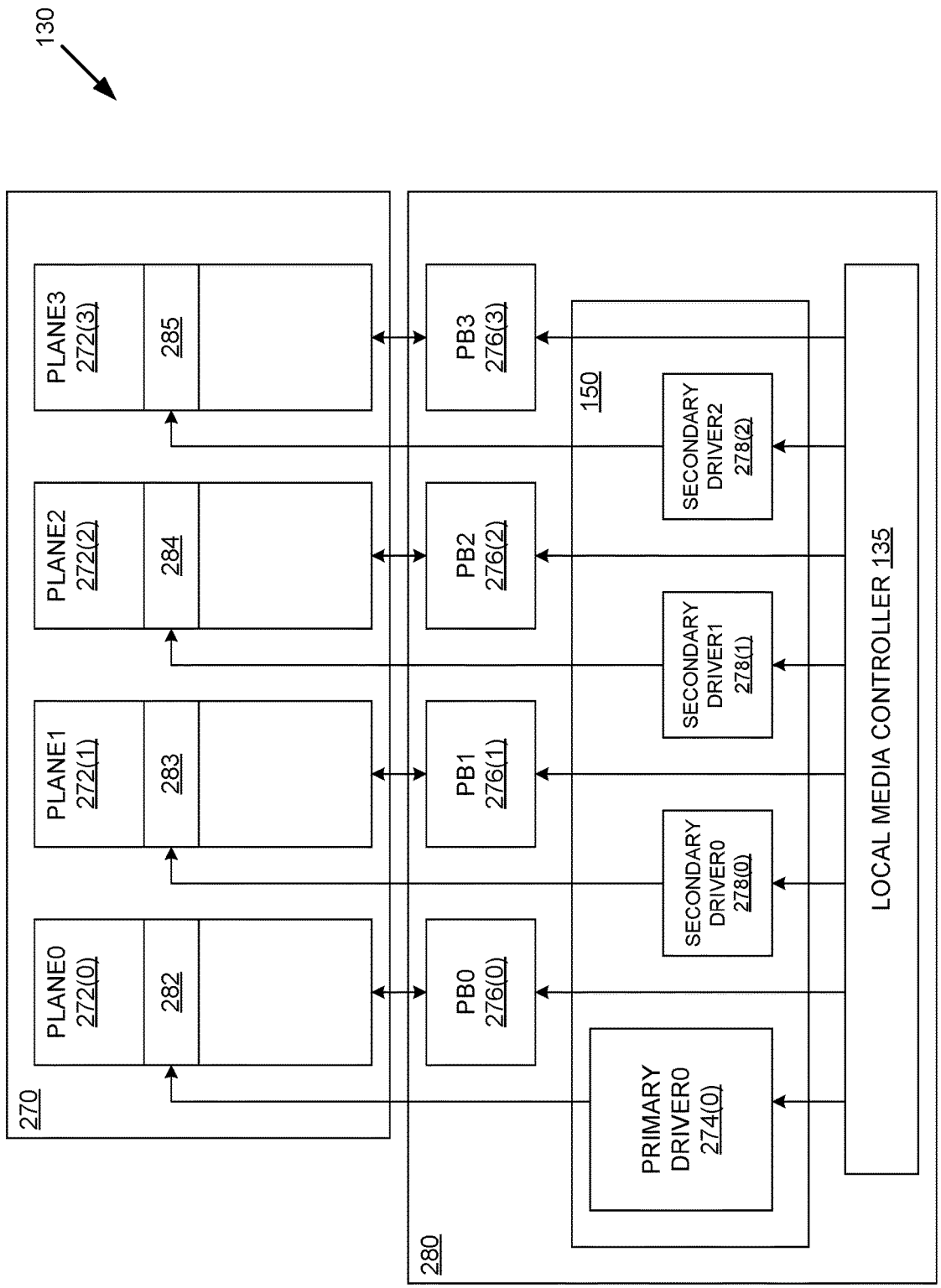
FIG. 2 is a block diagram illustrating a multi-plane memory device with asymmetric plane driver circuits in accordance with some embodiments of the present disclosure.

FIG. 2 is a block diagram illustrating a multi-plane memory device with asymmetric plane driver circuits in accordance with some embodiments of the present disclosure. The memory device 130 includes a memory array 270 divided into memory planes 272(0)-272(3) that each includes a respective number of memory cells. The multi-plane memory device 130 can further include a logic layer 280 disposed under memory array 270. Among other components, the logic layer 280 can include local media controller 135, including a power control circuit and access control circuit for concurrently performing memory access operations for different memory planes 272(0)-272(3). The memory cells can be non-volatile memory cells, such as NAND flash cells, or can generally be any type of memory cells.

The memory planes 272(0)-272(3) can each be divided into blocks of data, with a different relative block of data from each of the memory planes 272(0)-272(3) concurrently accessible during memory access operations. For example, during memory access operations, data block 282 of the memory plane 272(0), data block 283 of the memory plane 272(1), data block 284 of the memory plane 272(2), and data block 285 of the memory plane 272(3) can each be accessed concurrently.

Each of the memory planes 272(0)-272(3) can be coupled to a respective page buffer (PB) 276(0)-276(3). Each page buffer 276(0)-276(3) can be configured to provide data to or receive data from the respective memory plane 272(0)-272(3). The page buffers 276(0)-276(3) can be controlled by local media controller 135. Data received from the respective memory plane 272(0)-272(3) can be latched at the page buffers 276(0)-276(3), respectively, and retrieved by local media controller 135, and provided to the memory sub-system controller 115 via the NVMe interface.

Each of the memory planes 272(0)-272(3) can be further coupled to a respective plane driver circuit, such as an access line driver circuit. In one embodiment, the logic layer 280 includes asymmetric plane driver circuits 150, such as primary plane driver circuit 274(0) and secondary plane driver circuits 278(0)-278(2). The plane driver circuits 274(0) and 278(0)-278(2) can be configured to condition a page of a respective block of an associated memory plane 272(0)-272(3) for a memory access operation. In one embodiment, primary plane driver circuit 274(0) is configured to perform multiple types memory access operations, such as programming data (i.e., writing data), reading data, or erasing data, while each secondary plane driver circuit 278(0)-278(2) is configured to perform only one type of memory access operation, such as reading data. Each of the plane driver circuits 274(0) and 278(0)-278(2) can be coupled to a respective global access lines associated with a respective memory plane 272(0)-272(3). Each of the global access lines can be selectively coupled to respective local access lines within a block of a plane during a memory access operation associated with a page within the block. The plane driver circuits 274(0) and 278(0)-278(2) can be controlled based on signals from local media controller 135. Each of the plane driver circuits 274(0) and 278(0)-278(2) can include or be coupled to a respective power circuit, and can provide voltages to respective access lines based on voltages provided by the respective power circuit. The voltages provided by the power circuits can be based on signals received from local media controller 135.

The local media controller 135 can control the plane driver circuits 274(0) and 278(0)-278(2) and page buffers 276(0)-276(3) to concurrently perform memory access operations associated with each of a group of memory command and address pairs (e.g., received from memory sub-system controller 115). For example, local media controller 135 can control the plane driver circuits 274(0) and 278(0)-278(2) and page buffer 376(0)-376(3) to perform the concurrent memory access operations. Local media controller 135 can include a power control circuit that serially configures two or more of the plane driver circuits 274(0) and 278(0)-278(2) for the concurrent memory access operations, and an access control circuit configured to control two or more of the page buffers 276(0)-276(3) to sense and latch data from the respective memory planes 272(0)-272(3), or program data to the respective memory planes 272(0)-272(3) to perform the concurrent memory access operations.

In operation, local media controller 135 can receive a group of memory command and address pairs via the NVMe bus, with each pair arriving in parallel or serially. In some examples, the group of memory command and address pairs can each be associated with different respective memory planes 272(0)-272(3) of the memory array 270. The local media controller 135 can be configured to perform concurrent memory access operations (e.g., read operations or program operations) for the different memory planes 272(0)-272(3) of the memory array 370 responsive to the group of memory command and address pairs. For example, the power control circuit of local media controller 135 can serially configure, for the concurrent memory access operations based on respective page type (e.g., LP, UP, XP, TP, SLC/MLC/TLC/QLC page), the plane driver circuits 274(0) and 278(0)-278(2) for two or more memory planes 272(0)-272(3) associated with the group of memory command and address pairs. In one embodiment, the page types can include lower pages (LPs), upper pages (UPs), extra pages (XPs), and top pages (TPs). Each bit of the memory cell is stored at a different page portion of the memory cell. Various read level thresholds can be used for the various page types: SLC logical page types are lower logical pages (LPs), MLC logical page types are LPs and upper logical pages (UPs), TLC logical page types are LPs, UPs, and extra logical pages (XPs), and QLC logical page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. After the plane driver circuits 274(0) and 278(0)-278(2) have been configured, the access control circuit of local media controller 135 can concurrently control the page buffers 276(0)-276(3) to access the respective pages of each of the two or more memory planes 272(0)-272(3) associated with the group of memory command and address pairs, such as retrieving data or writing data, during the concurrent memory access operations. For example, the access control circuit can concurrently (e.g., in parallel and/or contemporaneously) control the page buffers 276(0)-276(3) to charge/discharge bitlines, sense data from the two or more memory planes 272(0)-272(3), and/or latch the data.

Based on the signals received from local media controller 135, the plane driver circuits 274(0) and 278(0)-278(2) that are coupled to the memory planes 272(0)-272(3) associated with the group of memory command and address command pairs can select blocks of memory or memory cells from the associated memory plane 272(0)-272(3), for memory operations, such as read, program, and/or erase operations. The plane driver circuits 274(0) and 278(0)-278(2) can drive different respective global access lines associated with a respective memory plane 272(0)-272(3). As an example, the primary plane driver circuit 274(0) can drive a first voltage on a first global access line associated with the memory plane 272(0), the secondary driver circuit 278(0) can drive a second voltage on a third global access line associated with the memory plane 272(1), the secondary driver circuit 278(1) can drive a third voltage on a seventh global access line associated with the memory plane 272(2), etc., and other voltages can be driven on each of the remaining global access lines. In some examples, pass voltages can be provided on all access lines except an access line associated with a page of a memory plane 272(0)-272(3) to be accessed. The local media controller 135 and the plane driver circuits 274(0) and 278(0)-278(2) can allow different respective pages, and the page buffers 276(0)-276(3) within different respective blocks of memory cells, to be accessed concurrently. For example, a first page of a first block of a first memory plane can be accessed concurrently with a second page of a second block of a second memory plane, regardless of page type.

The page buffers 276(0)-276(3) can provide data to or receive data from the local media controller 135 during the memory access operations responsive to signals from the local media controller 135 and the respective memory planes 272(0)-272(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The local media controller 135 and the plane driver circuits 274(0) and 278(0)-278(2) can concurrently access different respective pages within different respective blocks of different memory planes when the different respective pages are of a different page type. In one embodiment, local media controller 135 can configure routing circuitry (e.g., signal routing lines and switches (not shown)) in memory device to couple the plane driver circuits 274(0) and 278(0)-278(2) to corresponding memory planes 272(0)-272(3) to perform memory access operations. For example, local media controller 135 can configure the routing circuitry to operatively couple primary plane driver circuit 274(0) to memory plane 272(0) and to operatively couple secondary plane driver circuit 278(0) to memory plane 272(1) to concurrently perform read operations corresponding to received memory access commands. In another embodiment, local media controller 135 can configure the routing circuitry to operatively couple primary plane driver circuit 274(0) and one or more different secondary plane driver circuits 278(0)-278(2) to corresponding memory planes. In another embodiment, local media controller 135 can configure the routing circuitry to operatively couple two or more of secondary plane driver circuits 278(0)-278(2) to corresponding memory planes. In another embodiment, local media controller 135 can configure the routing circuitry to operatively couple primary plane driver circuit 274(0) to two or more of memory planes 272(0)-272(3) to perform a program operation or erase operation on the two or more planes in parallel. The reduced footprint area of secondary plane driver circuits 278(0)-278(2) relative to that of primary plane driver circuit 274(0) allows logic layer 280 to have a smaller footprint than if a primary plane driver circuit were included for each plane of memory device 130. In addition, the scalability of additional memory planes or vertical memory tiers to the memory array of the memory device 130 is possible without incurring proportional increases to the footprint of the logic layer 280.

Figure 3:
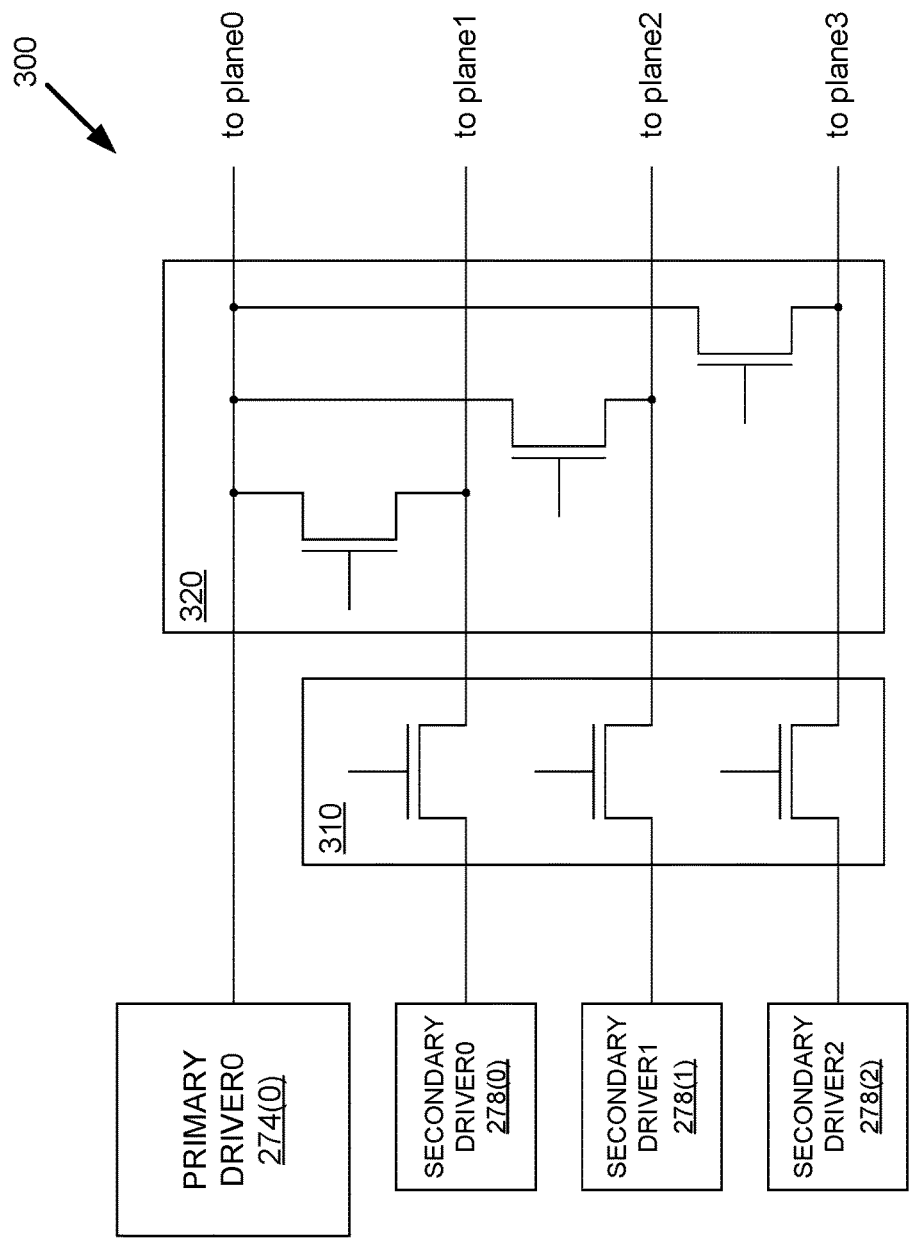
FIG. 3 is a block diagram illustrating routing circuitry having one switching configuration for asymmetric plane driver circuits in a multi-plane memory device in accordance with some embodiments of the present disclosure.

FIG. 3 is a block diagram illustrating routing circuitry 300 having one switching configuration for asymmetric plane driver circuits in a multi-plane memory device in accordance with some embodiments of the present disclosure. As illustrated in FIG. 3, primary plane driver circuit 274(0) and secondary plane driver circuits 278(0)-278(2) are each coupled to a corresponding memory plane of memory device 130 by associated signal routing lines. In one embodiment, there is a number of secondary plane driver circuits 278(0)-278(2) which is one less than the number of planes. In one embodiment, there is a number of primary plane driver circuits 274(0), wherein a sum of the number of primary plane driver circuits 274(0) and the number of secondary plane driver circuits 278(0)-278(2) equals the number of planes. Routing circuitry 300 further includes a first set of switches 310 and a second set of switches 320. Each of the first set of switches 310 and the second set of switches 320 can be implemented by a metal-oxide-semiconductor field-effect transistor (MOSFET) device or other type of switching device. In one embodiment, the first set of switches 310 includes one switching device associated with each of secondary plane driver circuits 278(0)-278(2) and positioned along the signal routing line between the secondary plane driver circuit and the corresponding memory plane. Each switching device in the first set of switches 310 is separately controllable by a control signal (e.g., received from local media controller 135 or some other control logic) to couple the associated one of secondary plane driver circuits 278(0)-278(2) with the corresponding memory plane. For example, each switching device in the first set of switches 310 can be activated (i.e., closed) when the associated one of secondary plane driver circuits 278(0)-278(2) is performing a memory access operation (e.g., a read operation) on the corresponding memory plane. The design of routing circuitry 300 allows one or more of the switching devices in the first set of switches 310 to be activated concurrently so that one or more of secondary plane driver circuits 278(0)-278(2) can concurrently perform memory access operations.

In one embodiment, primary plane driver circuit 274(0) is directly connected to a corresponding memory plane (e.g., plane0) such that any signal output by primary plane driver circuit 274(0) is applied to that plane. In another embodiment, a switching device is present in the signal routing line to selectively couple the primary plane driver circuit 274(0) with the corresponding plane. In one embodiment, the second set of switches 320 includes one switching device associated with each remaining plane (e.g., plane1, plane2, plane3) in memory device 130 and positioned along the signal routing line between the primary plane driver circuit 274(0) and the corresponding memory plane. Each switching device in the second set of switches 320 is separately controllable by a control signal (e.g., received from local media controller 135 or some other control logic) to couple the primary plane driver circuit 274(0) with the corresponding memory plane. For example, each switching device in the second set of switches 320 can be activated (i.e., closed) when the primary plane driver circuit 274(0) is performing a memory access operation (e.g., a program or erase operation) on the corresponding memory plane. The design of routing circuitry 300 allows one or more of the switching devices in the second set of switches 320 to be activated concurrently so that primary plane driver circuit 274(0) can perform a memory access operation on multiple planes in parallel. During such an operation, each switching device in the first set of switches 310 can be deactivated (i.e., opened) to decouple the secondary plane driver circuits 278(0)-278(2) from the corresponding memory planes.

Figure 4:
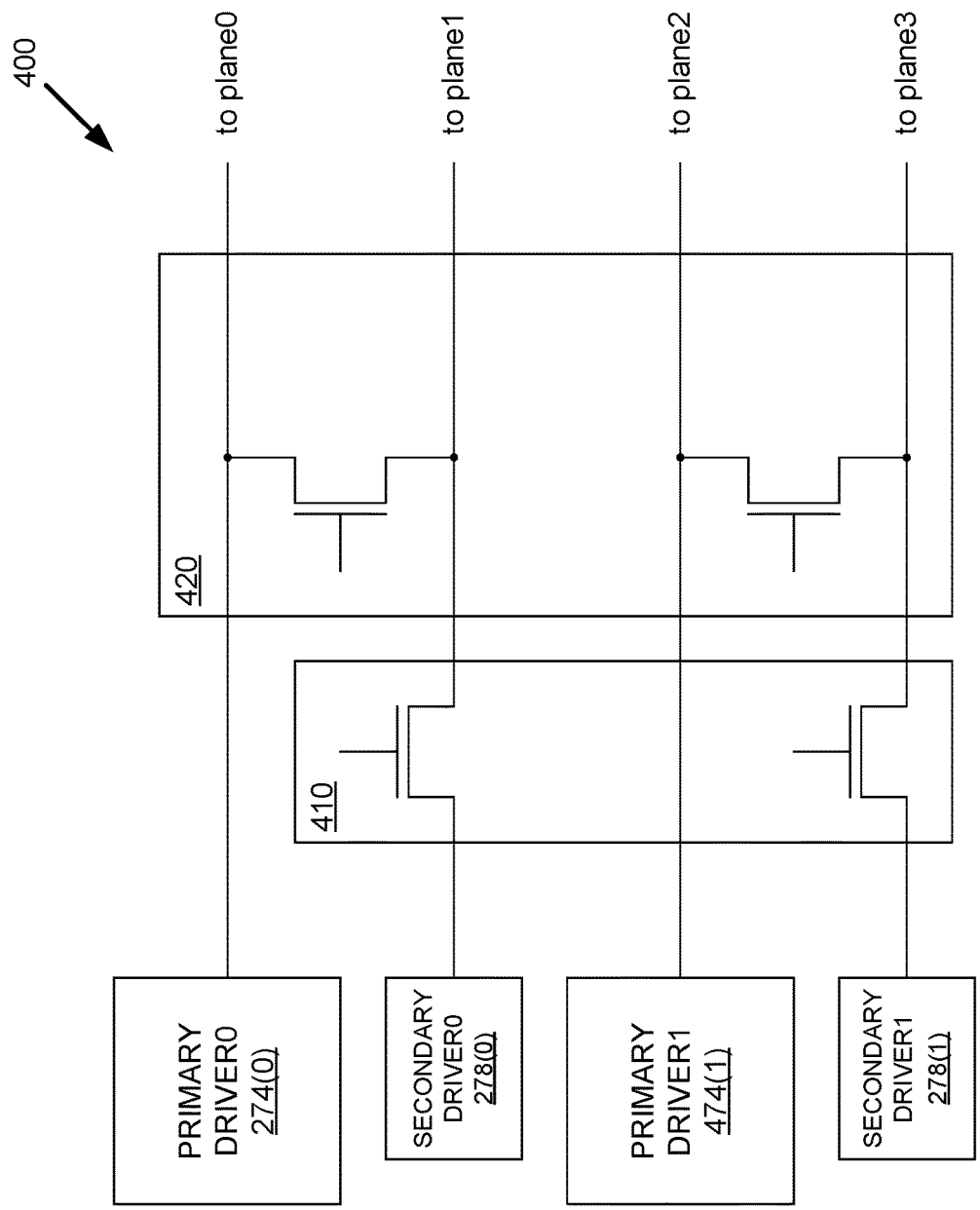
FIG. 4 is a block diagram illustrating routing circuitry having one switching configuration for asymmetric plane driver circuits in a multi-plane memory device in accordance with some embodiments of the present disclosure.

FIG. 4 is a block diagram illustrating routing circuitry 400 having one switching configuration for asymmetric plane driver circuits in a multi-plane memory device in accordance with some embodiments of the present disclosure. In one embodiment, the memory device can include multiple primary plane driver circuits, such as primary plane driver circuit 274(0) and primary plane driver circuit (474(1)). As illustrated in FIG. 4, primary plane driver circuits 274(0) and 474(1) and secondary plane driver circuits 278(0)-278(1) are each coupled to a corresponding memory plane of memory device 130 by associated signal routing lines. Routing circuitry 400 further includes a first set of switches 410 and a second set of switches 420. Each of the first set of switches 410 and the second set of switches 420 can be implemented by a MOSFET device or other type of switching device. In one embodiment, the first set of switches 410 includes one switching device associated with each of secondary plane driver circuits 278(0)-278(1) and positioned along the signal routing line between the secondary plane driver circuit and the corresponding memory plane. Each switching device in the first set of switches 410 is separately controllable by a control signal (e.g., received from local media controller 135 or some other control logic) to couple the associated one of secondary plane driver circuits 278(0)-278(1) with the corresponding memory plane. For example, each switching device in the first set of switches 410 can be activated (i.e., closed) when the associated one of secondary plane driver circuits 278(0)-278(2) is performing a memory access operation (e.g., a read operation) on the corresponding memory plane. The design of routing circuitry 400 allows one or more of the switching devices in the first set of switches 410 to be activated concurrently so that one or more of secondary plane driver circuits 278(0)-278(1) can concurrently perform memory access operations.

In one embodiment, primary plane driver circuit 274(0) is directly connected to a corresponding memory plane (e.g., plane0) such that any signal output by primary plane driver circuit 274(0) is applied to that plane. Similarly, primary plane driver circuit 474(1) is directly connected to a corresponding memory plane (e.g., plane2) such that any signal output by primary plane driver circuit 474(1) is applied to that plane. In another embodiment, switching devices are present in the signal routing lines to selectively couple primary plane driver circuits 274(0) and 474(1) with the corresponding planes. In one embodiment, the second set of switches 420 includes one switching device associated with each remaining plane (e.g., plane1, plane3) in memory device 130 and positioned along the signal routing line between one of primary plane driver circuit 274(0) and 474(1) and the corresponding memory plane. Each switching device in the second set of switches 420 is separately controllable by a control signal (e.g., received from local media controller 135 or some other control logic) to couple the primary plane driver circuit 274(0) or 474(1) with the corresponding memory plane. For example, each switching device in the second set of switches 420 can be activated (i.e., closed) when the primary plane driver circuit 274(0) or 474(1) is performing a memory access operation (e.g., a program or erase operation) on the corresponding memory plane. The design of routing circuitry 400 allows one or more of the switching devices in the second set of switches 420 to be activated concurrently so that primary plane driver circuit 274(0) or 474(1) can perform a memory access operation on multiple planes in parallel. During such an operation, each switching device in the first set of switches 410 can be deactivated (i.e., opened) to decouple the secondary plane driver circuits 278(0)-278(2) from the corresponding memory planes.

Figure 5:
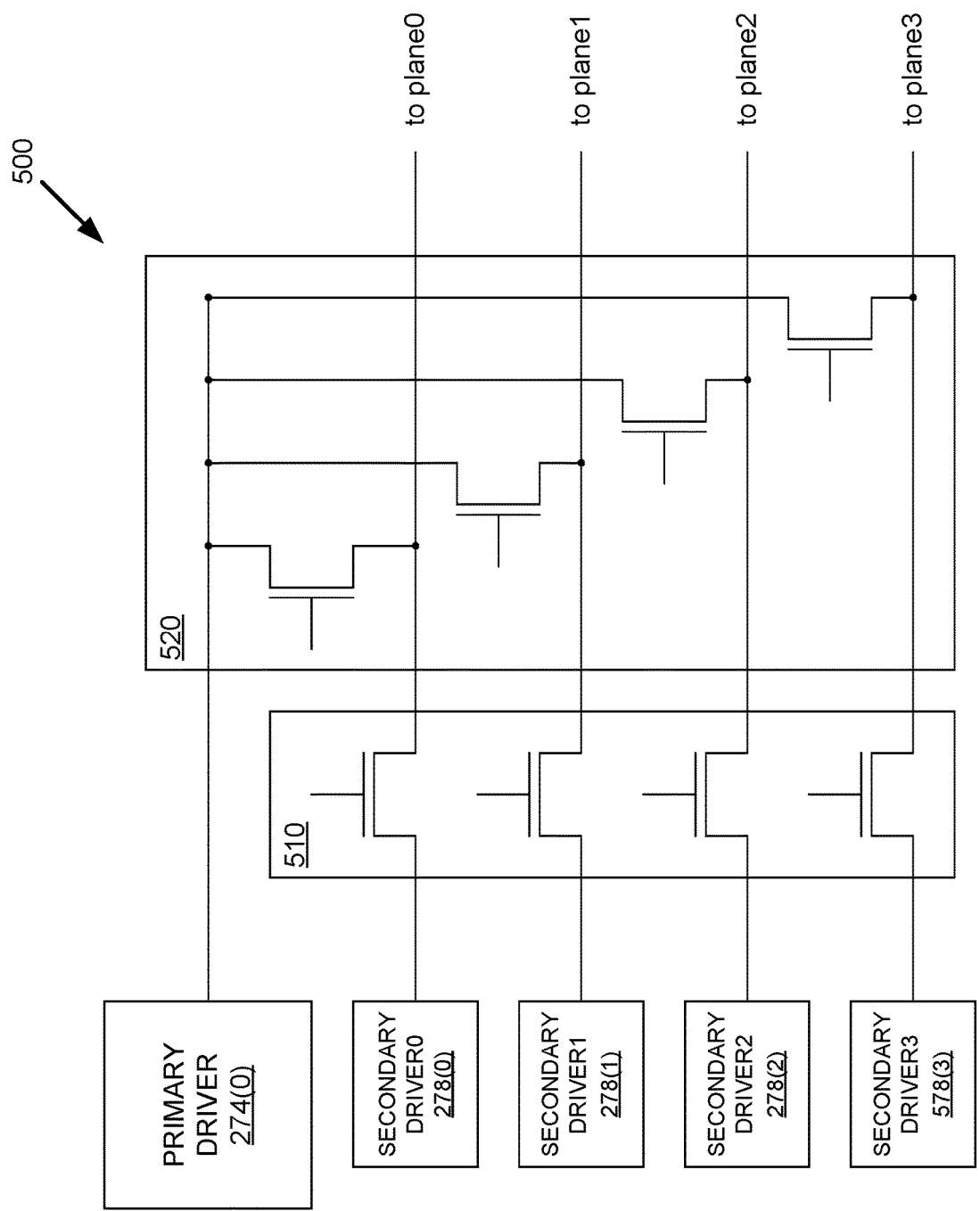
FIG. 5 is a block diagram illustrating routing circuitry having one switching configuration for asymmetric plane driver circuits in a multi-plane memory device in accordance with some embodiments of the present disclosure.

FIG. 5 is a block diagram illustrating routing circuitry 500 having one switching configuration for asymmetric plane driver circuits in a multi-plane memory device in accordance with some embodiments of the present disclosure. As illustrated in FIG. 5, secondary plane driver circuits 278(0)-278(2) and 578(3) are each coupled to a corresponding memory plane of memory device 130 by associated signal routing lines. In this embodiment, primary plane driver circuit 274(0) does not have any one corresponding memory plane. Routing circuitry 500 further includes a first set of switches 510 and a second set of switches 520. Each of the first set of switches 510 and the second set of switches 520 can be implemented by a MOSFET device or other type of switching device. In one embodiment, the first set of switches 510 includes one switching device associated with each of secondary plane driver circuits 278(0)-278(2) and 578(3) and positioned along the signal routing line between the secondary plane driver circuit and the corresponding memory plane. Each switching device in the first set of switches 510 is separately controllable by a control signal (e.g., received from local media controller 135 or some other control logic) to couple the associated one of secondary plane driver circuits 278(0)-278(2) and 578(3) with the corresponding memory plane. For example, each switching device in the first set of switches 510 can be activated (i.e., closed) when the associated one of secondary plane driver circuits 278(0)-278(2) and 578(3) is performing a memory access operation (e.g., a read operation) on the corresponding memory plane. The design of routing circuitry 500 allows one or more of the switching devices in the first set of switches 510 to be activated concurrently so that one or more of secondary plane driver circuits 278(0)-278(2) and 578(3) can concurrently perform memory access operations.

In one embodiment, primary plane driver circuit 274(0) is not directly connected to a corresponding memory plane. In one embodiment, the second set of switches 520 includes one switching device associated with each plane (e.g., plane 0, plane1, plane2, plane3) in memory device 130 and positioned along the signal routing line between the primary plane driver circuit 274(0) and the corresponding memory plane. Each switching device in the second set of switches 520 is separately controllable by a control signal (e.g., received from local media controller 135 or some other control logic) to couple the primary plane driver circuit 274(0) with the corresponding memory plane. For example, each switching device in the second set of switches 520 can be activated (i.e., closed) when the primary plane driver circuit 274(0) is performing a memory access operation (e.g., a program or erase operation) on the corresponding memory plane. The design of routing circuitry 500 allows one or more of the switching devices in the second set of switches 520 to be activated concurrently so that primary plane driver circuit 274(0) can perform a memory access operation on multiple planes in parallel. During such an operation, each switching device in the first set of switches 510 can be deactivated (i.e., opened) to decouple the secondary plane driver circuits 278(0)-278(2) and 578(3) from the corresponding memory planes.

Figure 6:
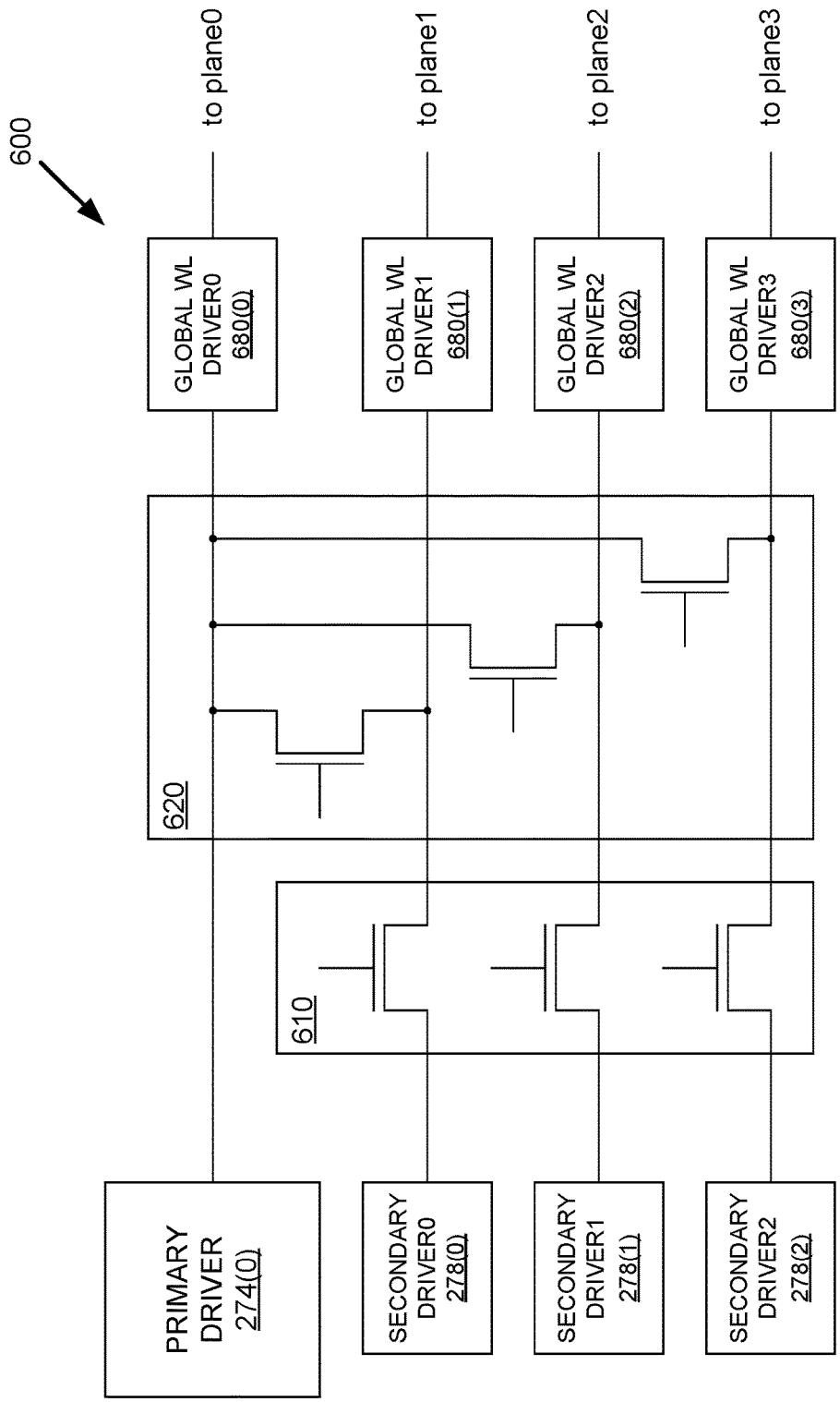
FIG. 6 is a block diagram illustrating routing circuitry having one switching configuration for asymmetric plane driver circuits and global wordline driver circuits in a multi-plane memory device in accordance with some embodiments of the present disclosure.

FIG. 6 is a block diagram illustrating routing circuitry 600 having one switching configuration for asymmetric plane driver circuits and global wordline driver circuits in a multi-plane memory device in accordance with some embodiments of the present disclosure. As illustrated in FIG. 6, primary plane driver circuit 274(0) and secondary plane driver circuits 278(0)-278(2) are each coupled to a corresponding one of global wordline (WL) driver circuits 680(0)-680(3) by associated signal routing lines. In turn, each one of global wordline driver circuits 680(0)-680(3) is coupled to a corresponding memory plane of memory device 130. Routing circuitry 600 further includes a first set of switches 610 and a second set of switches 620. Each of the first set of switches 610 and the second set of switches 620 can be implemented by a MOSFET device or other type of switching device. In one embodiment, the first set of switches 610 includes one switching device associated with each of secondary plane driver circuits 278(0)-278(2) and positioned along the signal routing line between the secondary plane driver circuit and the corresponding one of global wordline driver circuits 680(0)-680(3). Each switching device in the first set of switches 610 is separately controllable by a control signal (e.g., received from local media controller 135 or some other control logic) to couple the associated one of secondary plane driver circuits 278(0)-278(2) with the corresponding global wordline driver circuit and memory plane. For example, each switching device in the first set of switches 610 can be activated (i.e., closed) when the associated one of secondary plane driver circuits 278(0)-278(2) is performing a memory access operation (e.g., a read operation) on the corresponding memory plane. The design of routing circuitry 600 allows one or more of the switching devices in the first set of switches 610 to be activated concurrently so that one or more of secondary plane driver circuits 278(0)-278(2) can concurrently perform memory access operations. In FIG. 6, primary plane driver circuit 274(0) and global wordline driver 680(0) together perform the same functionality as the primary plane driver circuit 274(0) in FIG. 3, but one advantage is a reduced number of high voltage switches routing circuitry 600, as compared to routing circuitry 300 in FIG. 3. This results in a significant area savings for routing circuitry 600. In FIG. 6, the number of signals between primary plane driver circuit 274(0) and global wordline driver 680(0) is lower than the number of signals output from the primary plane driver circuit 274(0) in FIG. 3, which can be the same as the number of wordlines per block. This translates to lower number of switches in routing circuitry 600 when compared to the number of switches in routing circuitry 300 (not all switches are illustrated in FIG. 3), resulting is more area savings.

In one embodiment, primary plane driver circuit 274(0) is directly connected to a corresponding global wordline driver circuit 680(0) such that any signal output by primary plane driver circuit 274(0) is applied to that global wordline driver circuit 680(0). In another embodiment, a switching device is present in the signal routing line to selectively couple the primary plane driver circuit 274(0) with the corresponding global wordline driver circuit 680(0). In one embodiment, the second set of switches 620 includes one switching device associated with each remaining global wordline driver circuit 680(1)-680(3) in memory device 130 and positioned along the signal routing line between the primary plane driver circuit 274(0) and the corresponding global wordline driver circuit. Each switching device in the second set of switches 620 is separately controllable by a control signal (e.g., received from local media controller 135 or some other control logic) to couple the primary plane driver circuit 274(0) with the corresponding global wordline driver circuit. For example, each switching device in the second set of switches 620 can be activated (i.e., closed) when the primary plane driver circuit 274(0) is performing a memory access operation (e.g., a program or erase operation) on the corresponding memory plane. The design of routing circuitry 600 allows one or more of the switching devices in the second set of switches 620 to be activated concurrently so that primary plane driver circuit 274(0) can perform a memory access operation on multiple planes in parallel. During such an operation, each switching device in the first set of switches 610 can be deactivated (i.e., opened) to decouple the secondary plane driver circuits 278(0)-278(2) from the corresponding global wordline driver circuits.

Figure 7:
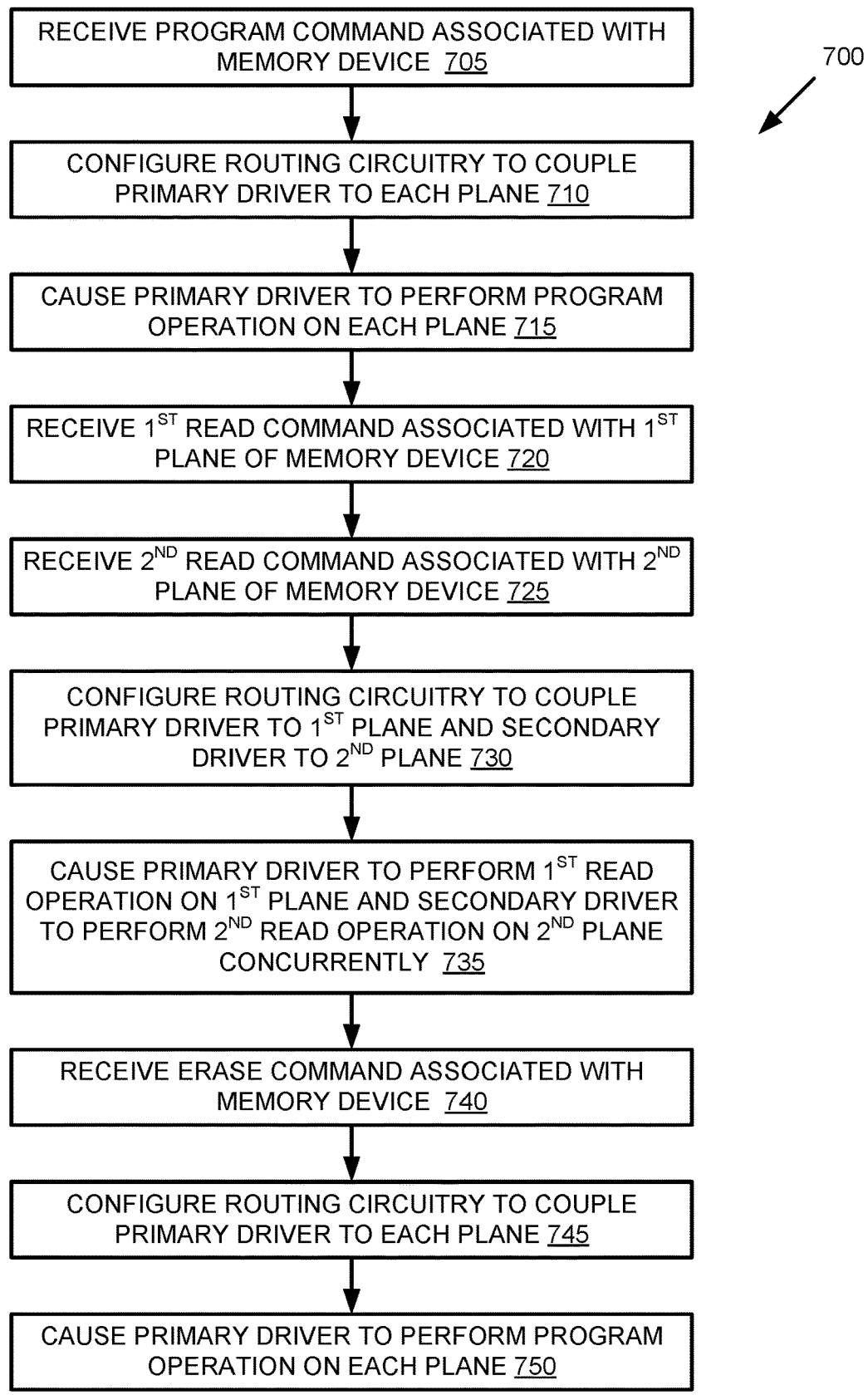
FIG. 7 is a flow diagram of an example method of operation of asymmetric plane driver circuits in a multi-plane memory device in a memory sub-system in accordance with some embodiments of the present disclosure.

FIG. 7 is a flow diagram of an example method of operation of asymmetric plane driver circuits in a multi-plane memory device in a memory sub-system in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by local media controller 135 and asymmetric plane driver circuits 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, a memory access command is received. For example, processing logic (e.g., local media controller 135) can receive a first memory access command directed to a memory device, such as memory device 130. In one embodiment, the first memory access command is a program command, which can be received from a controller, such as memory sub-system controller 115, some other component of memory sub-system 110, or from an external component, such as host system 120. In one embodiment, the program command specifies at least one of a logical or physical address associated with data to be programmed to memory device 130. The logical or physical address can correspond to one or more blocks of data to be stored on one or more planes, such as memory planes 272(0)-272(3), of a memory array 270 of the memory device 130. In one embodiment, local media controller 135 can maintain a mapping of memory addresses to each of the memory planes 272(0)-272(3).

At operation 710, routing circuitry is configured. For example, the processing logic can configure switching devices within the routing circuitry to couple a primary plane driver circuit, such as primary plane driver circuit 274(0), to one or more memory planes, such as planes 272(0)-272(3) to perform a program operation corresponding to the program command. In one embodiment, local media controller 135, or other control logic, causes a control signal to be applied to one or more switching devices of a second set of switches 320 in routing circuitry 300 to activate those switching devices to couple primary plane driver circuit 274(0) to one or more of memory planes 272(0)-272(3) on which data can be programmed in parallel. Depending on the embodiment, memory device can include routing circuitry 300, 400, 500, 600, or some other routing circuitry, any of which can be configured as described above.

At operation 715, a program operation is performed. For example, the processing logic can cause primary plane driver circuit 274(0) to perform the program operation on one or more of memory planes 272(0)-272(3) of memory device 130. During the program operation, a program voltage is applied to selected wordlines of the planes of memory device 130, in order to program a certain level of charge to the selected memory cells on the wordlines representative of a desired value, which can be specified in the memory request command received at operation 705.

At operations 720 and 725, memory access commands are received. For example, processing logic (e.g., local media controller 135) can receive a second memory access command and a third memory access command directed to the memory device, such as memory device 130. In one embodiment, the second and third memory access commands are read commands, which can be received from the controller, such as memory sub-system controller 115, some other component of memory sub-system 110, or from an external component, such as host system 120. In one embodiment, the read commands each specify at least one of a logical or physical address associated with data to be read from memory device 130. Each logical or physical address can correspond to one or more blocks of data stored on one or more planes, such as memory planes 272(0)-272(3), of a memory array 270 of the memory device 130. In one embodiment, the first read command is associated with (i.e., directed to) a first plane (e.g., plane0 272(0)) and the second read command is associated with (i.e., directed to) a second plane (e.g., plane1 272(1)) of memory device 130.

At operation 730, routing circuitry is configured. For example, the processing logic can configure switching devices within the routing circuitry to couple one or more secondary plane driver circuits, such as secondary plane driver circuits 278(0)-278(3), to corresponding memory planes, such as planes 272(1)-272(3) to perform read operations corresponding to the read commands. In one embodiment, local media controller 135, or other control logic, causes a control signal to be applied to one or more switching devices of a first set of switches 310 in routing circuitry 300 to activate those switching devices to couple secondary plane driver circuit 278(0) to memory plane 272(1). Primary plane driver circuit 274(0) remains directly connected to memory plane 272(0). Depending on the embodiment, memory device can include routing circuitry 300, 400, 500, 600, or some other routing circuitry, any of which can be configured as described above.

At operation 735, read operations are performed. For example, the processing logic can cause primary plane driver circuit 274(0) to perform a first read operation on memory plane 272(0) and secondary plane driver circuit 278(0) to perform a second read operation on memory plane 272(1) concurrently (i.e., at least partially overlapping in time). During the read operations, a read voltage is applied to selected wordlines of the planes of memory device 130, in order to determine the level of charge stored at the selected memory cells on the wordlines, where the level of charge is representative of a stored value. In other embodiments, depending on which planes the memory commands received at operation 725 are directed, a different combination of primary plane driver circuit 274(0) and/or secondary plane driver circuits 278(1)-278(3) can be used. For example, primary plane driver circuit 274(0) and any of secondary plane driver circuits 278(1)-278(3) can perform concurrent read operations on the memory planes of memory device 130, or two or more of secondary plane driver circuits 278(1)-278(3) can perform concurrent read operations without involving primary plane driver circuit 274(0).

At operation 740, a memory access command is received. For example, processing logic (e.g., local media controller 135) can receive a fourth memory access command directed to a memory device, such as memory device 130. In one embodiment, the fourth memory access command is an erase command, which can be received from the controller, such as memory sub-system controller 115, some other component of memory sub-system 110, or from an external component, such as host system 120. In one embodiment, the erase command specifies at least one of a logical or physical address associated with data to be erased from memory device 130. The logical or physical address can correspond to one or more blocks of data to be stored on one or more planes, such as memory planes 272(0)-272(3), of a memory array 270 of the memory device 130.

At operation 745, routing circuitry is configured. For example, the processing logic can configure switching devices within the routing circuitry to couple the primary plane driver circuit, such as primary plane driver circuit 274(0), to one or more memory planes, such as planes 272(0)-272(3) to perform an erase operation corresponding to the erase command. In one embodiment, local media controller 135, or other control logic, causes a control signal to be applied to one or more switching devices of a second set of switches 320 in routing circuitry 300 to activate those switching devices to couple primary plane driver circuit 274(0) to one or more of memory planes 272(0)-272(3) from which data can be erased in parallel. Depending on the embodiment, memory device can include routing circuitry 300, 400, 500, 600, or some other routing circuitry, any of which can be configured as described above.

At operation 750, an erase operation is performed. For example, the processing logic can cause primary plane driver circuit 274(0) to perform the erase operation on one or more of memory planes 2721(0)-272(3) of memory device 130. During the erase operation, erase voltages are applied to memory device 130 in order to erase the programmed value(s).

Figure 8:
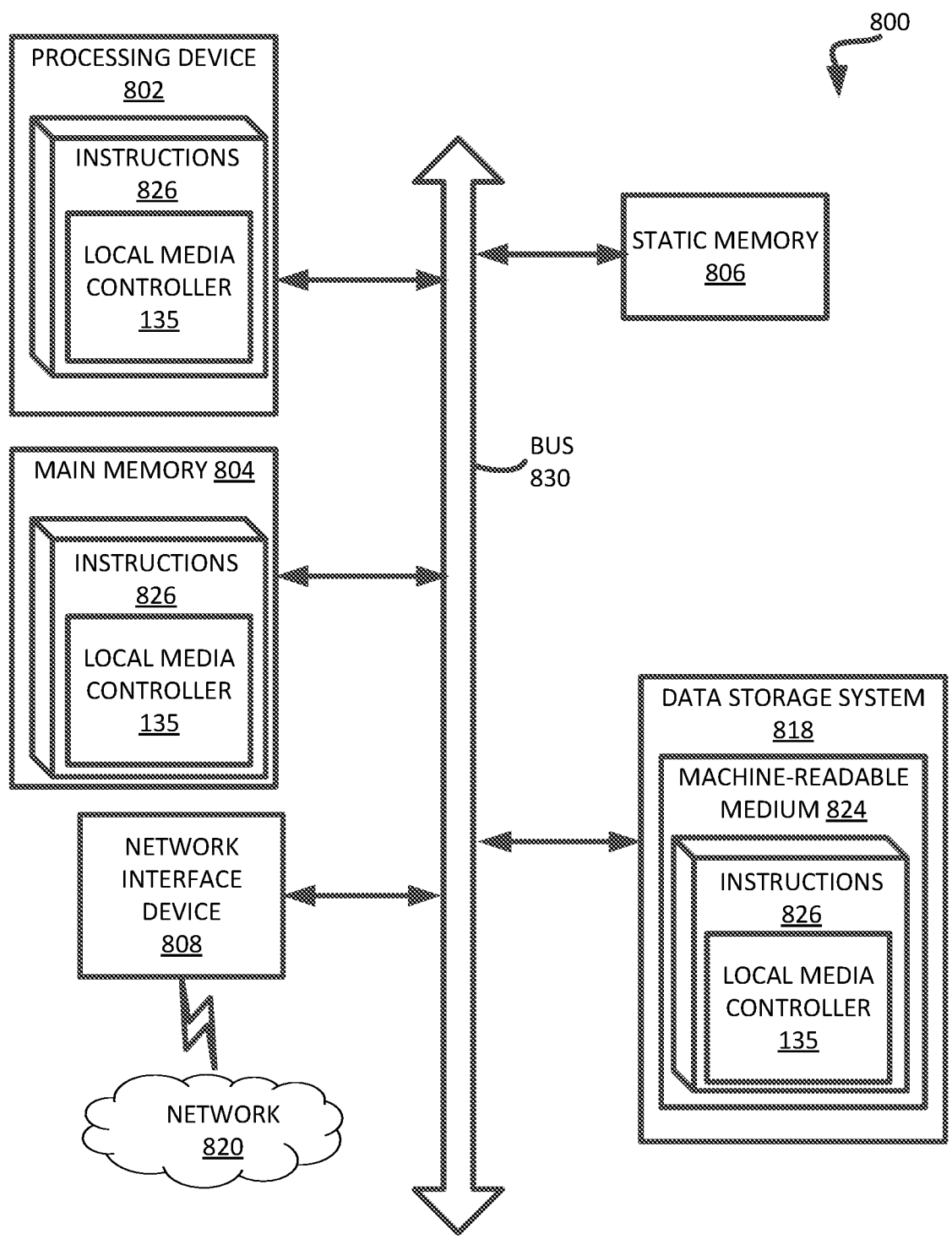
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to local media controller 135 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of planes;
   a primary plane driver circuit comprising components to support a plurality of types of memory access operations on any of the plurality of planes; and
   a plurality of secondary plane driver circuits, each comprising components to support a single type of memory access operation on an associated one of the plurality of planes concurrently with a memory access operation being performed by the primary plane driver circuit on a different one of the plurality of planes.

2. The memory device of claim 1, wherein each secondary plane driver circuit occupies a smaller footprint area than the primary plane driver circuit.

3. The memory device of claim 1, further comprising:
   a plurality of signal routing lines and switches to couple the primary plane driver circuit and the plurality of secondary plane driver circuits to the memory array; and
   control logic configured to configure the switches to operatively couple the primary plane driver circuit to a first plane and one of the plurality of secondary plane driver circuits to a second plane based on corresponding memory access commands received at the memory device.

4. The memory device of claim 1, wherein the plurality of planes comprises a first number of planes, the memory device further comprising:
   a second number of secondary plane driver circuits, wherein each of the second number of secondary plane driver circuits is associated with one of the first number of planes.

5. The memory device of claim 4, wherein the second number of secondary plane driver circuits is one less than the first number of planes.

6. The memory device of claim 4, further comprising:
   a third number of primary plane driver circuits, wherein a sum of the third number of primary plane driver circuits and the second number of secondary plane driver circuits equals the first number of planes.

7. The memory device of claim 4, further comprising:
   a first number of global wordline driver circuits, each corresponding to one of the first number of planes.

8. A memory device comprising:
   a memory array comprising a plurality of planes;
   a primary plane driver circuit;
   a plurality of secondary plane driver circuits, wherein each of the plurality of secondary plane driver circuits occupies a smaller footprint area than the primary plane driver circuit;
   routing circuitry to selectively couple the primary plane driver circuit and the plurality of secondary plane driver circuits to the memory array; and
   control logic configured to perform operations comprising:
      receiving a request to perform a first memory access operation associated with a first plane of the plurality of planes;

receiving a request to perform a second memory access operation associated with a second plane of the plurality of planes; and configuring the routing circuitry to operatively couple the primary plane driver circuit to the first plane and one of the secondary plane driver circuits to the second plane to concurrently perform the first memory access operation and the second memory access operation.

9. The memory device of claim 8, wherein the primary plane driver circuit comprises components to support read operations, program operations, and erase operations on any of the plurality of planes.

10. The memory device of claim 8, wherein the secondary plane driver circuit comprises components to support read operations on an associated one of the plurality of planes.

11. The memory device of claim 8, wherein the plurality of planes comprises a first number of planes, the memory device further comprising:

a second number of secondary plane driver circuits, wherein each of the second number of secondary plane driver circuits is associated with one of the first number of planes.

12. The memory device of claim 11, wherein the routing circuitry comprises:

a first set of switches, each switch of the first set of switches to couple one of the second number of plane driver circuits to an associated one of the first number of planes; and a second set of switches, each switch of the second set of switches to couple the primary plane driver circuit to a corresponding one of the first number of planes.

13. The memory device of claim 11, wherein the control logic configured to perform further operations comprising:

receiving a program command; and configuring the routing circuitry to operatively couple the primary plane driver circuit to each of the plurality of planes to perform a program operation corresponding to the program command.

14. The memory device of claim 11, wherein the control logic configured to perform further operations comprising:

receiving an erase command; and configuring the routing circuitry to operatively couple the primary plane driver circuit to each of the plurality of planes to perform an erase operation corresponding to the erase command.

15. A method comprising:

receiving a request to perform a first memory access operation associated with a first plane of a plurality of planes of a memory device;

receiving a request to perform a second memory access operation associated with a second plane of the plurality of planes; and configuring routing circuitry in the memory device to operatively couple a primary plane driver circuit to the first plane and one of a plurality of secondary plane driver circuits to the second plane to concurrently perform the first memory access operation and the second memory access operation.

16. The method of claim 15, wherein the primary plane driver circuit comprises components to support read operations, program operations, and erase operations on any of the plurality of planes.

17. The method of claim 15, wherein the secondary plane driver circuit comprises components to support read operations on an associated one of the plurality of planes.

18. The method of claim 15, wherein the plurality of planes comprises a first number of planes, and wherein the memory device comprises a second number of secondary plane driver circuits, the method further comprising:

configuring the routing circuitry to operatively couple the second number of secondary plane driver circuits with associated ones of the first number of planes.

19. The method of claim 18, wherein configuring the routing circuitry comprises:

configuring a first set of switches, each switch of the first set of switches to couple one of the second number of plane driver circuits to an associated one of the first number of planes; and configuring a second set of switches, each switch of the second set of switches to couple the primary plane driver circuit to a corresponding one of the first number of planes.

20. The method of claim 18, further comprising:

receiving a program command; and configuring the routing circuitry to operatively couple the primary plane driver circuit to each of the plurality of planes to perform a program operation corresponding to the program command.

* * * * *